United States Patent [19]

Wong

[11] Patent Number: 4,547,685
[45] Date of Patent: Oct. 15, 1985

[54] SENSE AMPLIFIER CIRCUIT FOR SEMICONDUCTOR MEMORIES

[75] Inventor: Thomas S. W. Wong, San Jose, Calif.

[73] Assignee: Advanced Micro Devices, Inc., Sunnyvale, Calif.

[21] Appl. No.: 544,323

[22] Filed: Oct. 21, 1983

[51] Int. Cl.[4] .................... H03K 5/24; H03K 3/356; H03K 17/04

[52] U.S. Cl. ............................. 307/530; 307/279; 307/578; 365/205; 365/208

[58] Field of Search ............... 307/530, 291, 578, 355, 307/362, 455; 365/189, 204, 205, 207, 208, 103, 104

[56] References Cited

U.S. PATENT DOCUMENTS

| | | | |
|---|---|---|---|
| 3,463,939 | 8/1969 | Sturman | 307/355 |
| 3,760,194 | 9/1973 | Lutz | 307/530 |
| 4,039,861 | 8/1977 | Heller et al. | 365/208 X |
| 4,162,539 | 7/1979 | Hebenstreit | 307/530 X |
| 4,264,832 | 4/1981 | Furman | 307/355 |
| 4,415,995 | 11/1983 | Glock | 307/530 X |

OTHER PUBLICATIONS

Ayling, "Differential Signal Phase Sensing and Latching Detector"; *IBM TDB;* vol. 14, No. 6, pp. 1674; 11/1971.

Schuster, "Sense Amplifier with Resistive Decoupling of Bit Lines"; *IBM TDB;* vol. 23, No. 7A, pp. 3037-3038, 12/1980.

Cordaro et al, "Amoeba Sense Amplifier and Regenerator"; *IBM TDB;* vol. 21, No. 4, pp. 1479-1482; 9/1978.

*Primary Examiner*—Larry N. Anagnos
*Attorney, Agent, or Firm*—J. Vincent Tortolano; Patrick T. King

[57] ABSTRACT

An improved sense amplifier circuit for sensing information in the cells of a semiconductor memory device is presented. The sense amplifier circuit as presented includes AC-coupled positive feedback means to provide a reduction in sensing delay time, and thus, faster memory access time.

6 Claims, 9 Drawing Figures

SENSE AMPLIFIER CIRCUIT FOR SEMICONDUCTOR MEMORIES

BACKGROUND OF THE INVENTION

1. Field of the Invention

The present invention relates to semiconductor memories. More particularly, the present invention relates to an improved sense amplifier circuit for decreasing memory access time.

2. Description of the Prior Art

Semiconductor devices are becoming increasingly sophisticated. One aspect of this sophistication is the increasing number of memory cells on a single chip. Additionally, increased speed has become an important requirement of a high performance memory system. Hence, as the number of semiconductor memory cells increase, reduced memory access time also becomes important.

A main factor in total memory access time is the sensing delay time, i.e., the time it takes to sense information in the cells of the semiconductor memory. A reduction in sensing delay time, therefore, is highly desirable. One known means of reducing sensing delay time is to use positive feedback within the sense amplifier.

A prior art circuit for reducing sensing delay time in a semiconductor memory by means of positive feedback is described in a paper entitled "A Fast 7.5ns Access 1K-Bit RAM for Cache-Memory Systems," *IEEE Journal of Solid-State Circuits*, p. 656 Vol. SC-13, No. 5, October 1978. In this reference, positive feedback for a sense amplifier is provided by a DC cross-coupling between two sense amplifier transistors.

SUMMARY OF THE INVENTION

An object of the present invention is to reduce memory access time in a semiconductor memory device by increasing speed of circuit operation.

Another object of the invention is to reduce sensing delay time by increasing the speed of operation of the sense amplifier circuit in a semiconductor memory device.

The present invention typically has application in an array of semiconductor memory cells as a sense amplifier for sensing the information stored in said memory cells. The sense amplifier circuit comprises an amplifying means, a first and second means for biasing the inputs of the sense amplifier, and an AC-coupled positive feedback circuit means.

The amplifying means has two input terminals (inverting and non-inverting) and two output terminals (inverted and non-inverted) and further includes: a first transistor coupled to a non-inverting sense current source; a second transistor coupled to an inverted sense current source; a first means for biasing the base of said first transistor; and a second means for biasing the base of said second transistor.

The AC-coupled positive feedback circuit means is disposed for coupling the inverted output terminal of the sense amplifier to the inverting input terminal, and for coupling the non-inverted output terminal to the non-inverting input terminal, so as to apply a portion of the ongoing output voltage from said output terminals through the positive feedback connections on said input terminals.

The present invention provides a substantial reduction in sensing delay time, thereby decreasing total memory access time. Another advantage of the present invention is the provision of a stable and efficient positive feedback circuit means. The use of AC-coupled positive feedback means avoids certain problems associated with the use of DC-coupled positive feedback means, resulting in substantially lower sensing delay time and therefore, faster access of information from the cells of a semiconductor memory device.

DETAILED DESCRIPTION OF THE PREFERRED EMBODIMENTS

Reference is now made in detail to the preferred embodiment of the invention which illustrate the best mode presently contemplated by the inventor for practicing the invention, the preferred embodiments of which are illustrated in the accompanying drawings.

In a typical semiconductor memory device, a plurality of memory cells are arranged in an array forming columns of bits and rows of words where each cell is disposed for storing and retrieving binary information. A sense amplifier circuit is provided for sensing information stored in the individual memory cells of the memory.

Figure 1:
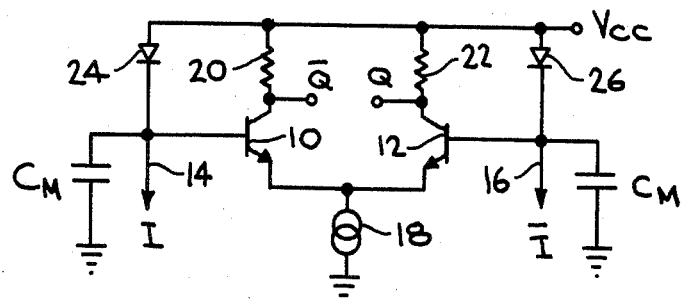
FIG. 1 is a diagram of a prior art basic sense amplifier without positive feedback circuit means.

FIG. 1 shows a typical prior art ECL sense amplifier circuit. Transistors 10 and 12 are configured as a differential amplifier transistor pair, responsive to a non-inverting sense current on signal line 14 and to an inverting sense current on signal line 16. Integrated differential amplifiers are widely used as sense amplifiers and offer significant advantages over discrete amplifiers, such as minimizing drift and temperature-tracking problems to thereby providing faster, more efficient circuit operation.

The prior art sense amplifier circuit has a pair of emitter-coupled transistors 10, 12 having their emitter terminals tied together and supplied with current from a current source 18. Inverting transistor 10 has its collector terminal coupled to a positive voltage supply means $V_{cc}$ through a resistance element 20. Non-inverting transistor 12 has its collector terminal coupled to $V_{cc}$ through a resistance element 22. The base terminal of transistor 10 is coupled to a biasing diode element 24 and is further coupled to the non-inverting sense current source on line 14. Diode element 24 is coupled to $V_{cc}$. The collector of inverting transistor 12 is coupled to $V_{cc}$ through a resistance element 22. The base terminal of transistor 12 is coupled to a diode element 26 and is further coupled to an inverting sense current source on line 16. The biasing diode element 26 is coupled to $V_{cc}$. In operation, a plurality of inverting and non-inverting bit lines from a semiconductor memory are connected to the respective inputs of the sense amplifier. The sense amplifier detects a difference between an inverting sense current and a non-inverting sense current from a memory. The sense currents are effectively converted to sense voltages at the inputs to the sense amplifier. The sense amplifier amplifies the difference between the sense voltages and provides an output differential voltage at the output terminals Q and $\overline{Q}$ which are connected to the respective collectors of Q12 and Q10. The plurality of bit lines connected to the inputs of the sense amplifier result in a very high capacitance $C_M$, on the order of 10 picofarads, at the input terminals of the differential sense amplifier, thereby slowing the operation of the sense amplifier.

Figure 2:
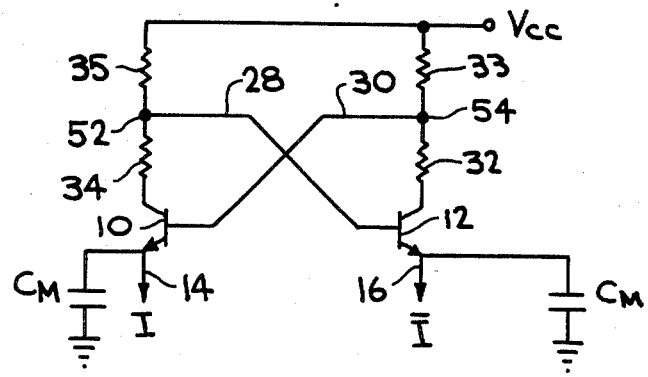
FIG. 2 is a diagram of a prior art sense amplifier including DC-coupled positive feedback circuit means.

To decrease the time which it takes the sense amplifier to sense and amplify the information in any particular cell of the semiconductor memory, positive feedback means have been proposed to increase the switching speed of the sense amplifier transistors. FIG. 2 shows a prior art sense amplifier in which DC-coupled positive feedback circuit means are used to shorten the offdelay time of the sensing transistors. Specifically, line 30 couples a portion of a non-inverted signal from the collector of transistor 12 to the noninverted input base terminal of transistor 10. Similarly, line 28 couples a portion of the inverted signal from the collector terminal of transistor 10 to the inverting input base terminal of transistor 12. This cross-coupling circuit provides positive feedback to decrease the respective transistor turn-on times. Resistors 32, 33 and 34, 35 respectively form voltage dividers to provide for positive feedback of a portion of the respective collector signals.

Certain problems are caused by the use of DC-coupled positive feedback means in the circuit of FIG. 2. Increased voltage swings at emitters of the sense amplifier transistors, in effect, nullify some of the potentially faster switching speeds because switching speed is directly proportional to the voltage swing and to the values of $C_M$. In order to take advantage of the increased speed of operation produced by using DC-coupled positive feedback, some form of synchronization, such as clocking means, must be used to synchronize the sense amplifier inputs because the switching operation of the sense amplifier is data-pattern sensitive as well as being cycle-time sensitive which causes variations in switching speeds. The increased circuitry and the increased delays to avoid these problems is unacceptable in high-speed bipolar memory design and, hence, DC-coupled positive feedback as shown in FIG. 2 is not normally used.

The use of AC-coupled positive feedback in a sense amplifier provided by the present invention solves the problems associated with DC-coupled feedback, while providing the increased speed of operation obtained by using positive feedback.

Figure 3:
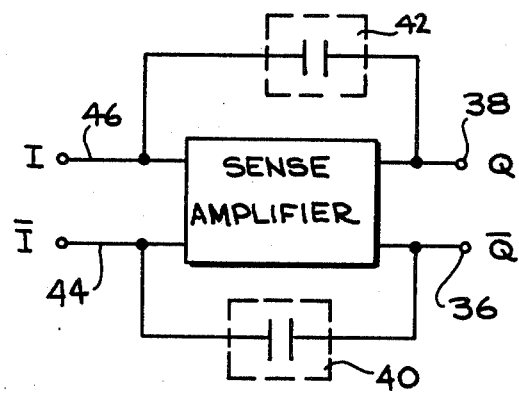
FIG. 3 is a block diagram showing the AC-coupled positive feedback circuit means of the present invention.

FIG. 3 is a block diagram showing a sense amplifier with an AC-coupled positive feedback means provided in accordance with the present invention. An inverted output terminal 36 is AC-coupled by means of a capacitive element 40 to an inverting input terminal 44. The non-inverted output terminal 38 is AC-coupled through a capacitive element 42 to an inverting input terminal 46.

Figure 4:
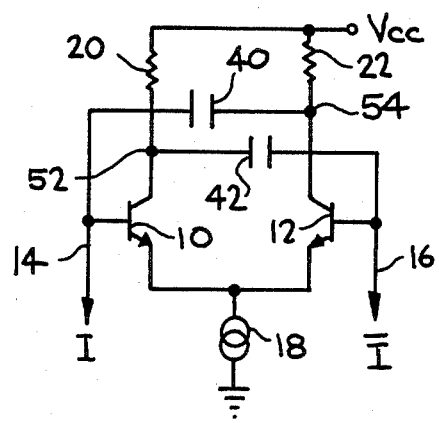
FIG. 4 is a detailed schematic diagram of one preferred embodiment of the sense amplifier circuit of the present invention.

FIG. 4 shows a schematic diagram of the principal elements of one preferred embodiment of the present invention, with elements common to FIG. 1 and FIG. 3 having the same reference numerals. AC-coupled positive feedback circuit means are provided by capacitors 40 and 42. Capacitor 40 is coupled between the collector (non-inverted output) terminal of transistor 12, and the base (non-inverting input) terminal of transistor 10. Capacitor 42 is coupled between the collector (inverted output) terminal of transistor 10, and the base (inverting input) terminal of transistor 12.

Figure 5:
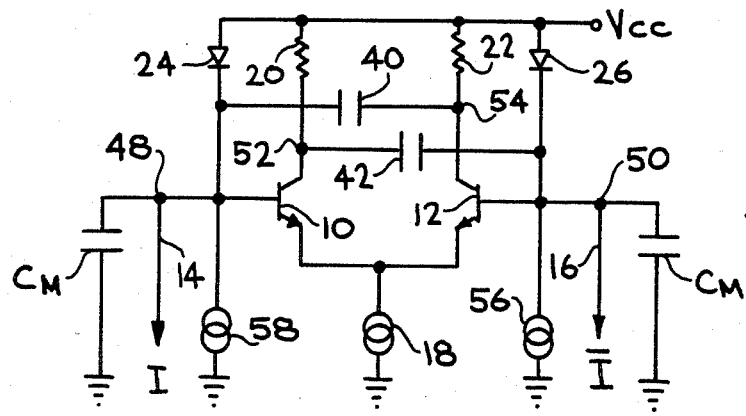
FIG. 5 is a further detailed schematic diagram of the circuit of the preferred embodiment of the present invention shown in FIG. 4.

FIG. 5 shows a sense amplifier which is similar to that of FIG. 4 with certain additions such as biasing diodes 24 and 26. Standby bias current sources 56, 58 are respectively provided to supply bias current to diodes 26 and 24. Capacitances $C_M$ are shown to indicate the combined capacitances of all the sense current lines connected to the respective input nodes 48, 50 of the sense amplifier. Capacitance $C_M$ have values on the order of about 10 picofarads and load the respective sense signal lines 14, 16 such that the sense currents must drive these capacitive loads. Due to this loading, the transistors 10, 12 are not able to respond immediately to changes in the sense currents, resulting in delays. The positive AC-feedback provided by capacitors 40, 42 speeds up operation of the sense amplifier.

Operation of the sense amplifier is as follows: a logic high level is provided at input node 48 when no current is present on line 14. This turns transistor 10 to a high conduction state. A logic low level is provided at input node 50 when an inverting current is present on line 16. This turns transistor 12 to a low conduction state.

Conversely, transistor 10 is switched to a low conduction state, or nearly off, when no sense current is on line 16 but when sense current is on line 14. In that case, transistor 12 is turned to a high conduction state. When transistor 12 is turned to a high conduction state, its collector terminal 54 is at a logic low level. Since transistor 10 is in a low conduction state, its collector terminal 52 is at a logic high level.

Capacitors 40, 42 speed up operation of the sense amplifier by providing positive feedback of portions of respective collector signals back to the base terminal inputs. The capacitors 40, 42 (typically 1 picofarad in value) respectively form voltage dividers with the respective capacitances $C_M$. Thus, a boost is given to the corresponding base terminal signals to speedup the switching times.

Figure 7A:
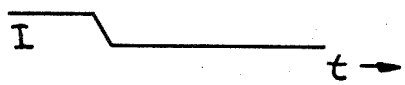
FIG. 7a shows current as a function of time at node 48 in the schematic diagram of FIG. 5.
Figure 7B:
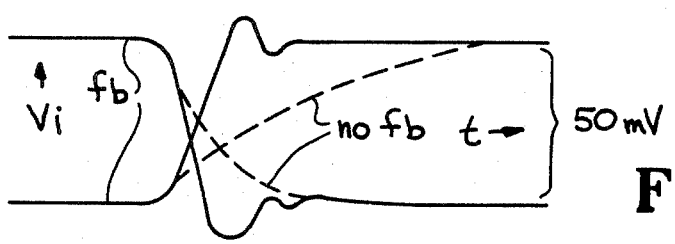
FIG. 7b shows voltage waveforms as a function of time at nodes 48 and 50 in the schematic diagram of FIG. 5.

FIG. 7a shows a representative non-inverting sense current I waveform on line 14. The inverting sense current $\overline{I}$ has a complementary waveform on line 16. Fig. 7b shows the input voltage waveforms Vi at the base terminals 48, 50. The solid lines are for a circuit with positive A-C feedback and the dotted lines are for a circuit without the feedback of the present invention.

Figure 7C:
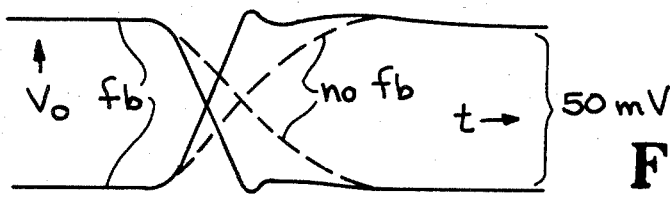
FIG. 7c shows voltage waveforms as a function of time at nodes 52 and 54 in the schematic diagram of FIG. 5.

Similarly, the solid lines of FIG. 7c shows the output voltage waveforms Vo at the collector terminals 52, 54 using positive A-C coupled feedback with the dotted lines representing the output voltage waveforms without the feedback of the present invention.

Significant speed improvements have been achieved such that sense amplifier delays on the order of 3 nanonseconds are reduced to about 1.5 nanoseconds using the invention. These improvements are significant for bipolar random access memories where overall memory access times in the range of 10 nanoseconds are desired.

Figure 6:
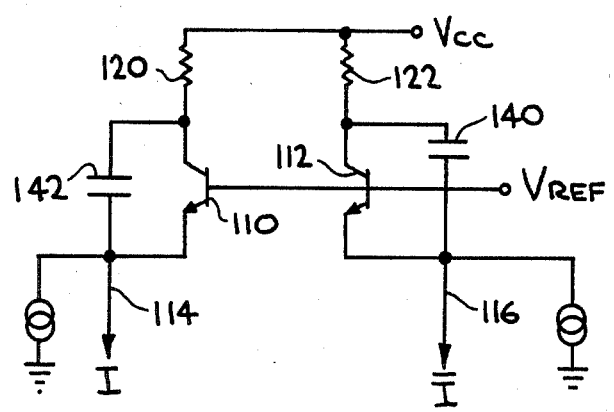
FIG. 6 is a detailed schematic diagram of another embodiment of the circuit of the present invention.

FIG. 6 is a schematic diagram of another preferred embodiment of the present invention which uses two common-base transistors as the sense amplifier active elements as opposed to the cross-coupled differential amplifier configuration of FIG. 4. Transistor 110 has its base terminal coupled to the base terminal of transistor 112 and further coupled to a reference voltage supply means $V_{REF}$. The emitter terminal of transistor 110 is coupled to a non-inverting sense current I signal line 114. The collector terminal of transistor 10 is coupled through resistance element 120 to a voltage supply means $V_{CC}$. The emitter terminal of transistor 112 is coupled to an inverting sense current $\bar{I}$ signal line 116. The collector terminal of transistor 112 is coupled to $V_{CC}$ through a resistance element 122. AC-coupled positive feedback is provided by capacitively coupling the emitter and collector terminals of transistor 110 through capacitor 142, and by capacitively coupling the emitter and collector terminals of transistor 112 through capacitor 140. This arrangement provides positive AC-coupled feedback for the sense amplifier.

The foregoing description of preferred embodiments of the invention have been presented for purposes of illustration and description. It is not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto and their equivalents.

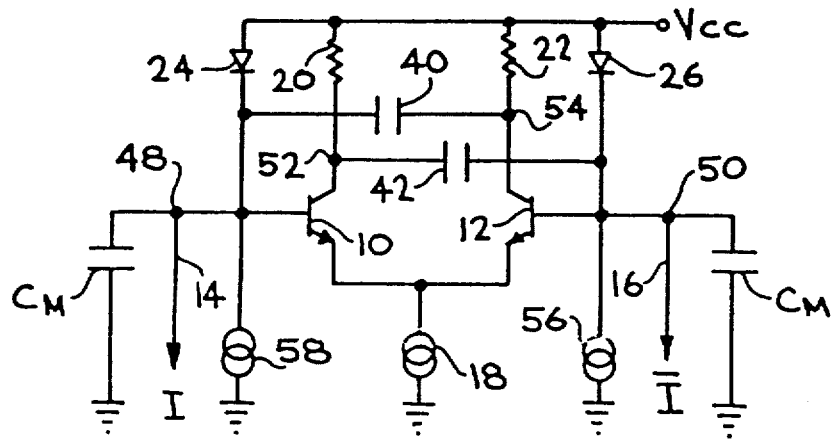

I claim:

1. An improved sense amplifier circuit for sensing a first sense current and a second sense current to thereby sense information in the cells of an semiconductor random access memory array, comprising:
   a first transistor having a collector terminal coupled through a first resistance element to a first voltage supply means, an emitter terminal coupled through a current source to a second voltage supply means, and a base terminal coupled to receive the first sense current;
   a second transistor having a collector terminal coupled through a second resistance element to said first voltage supply means, an emitter terminal coupled to the emitter terminal of said first transistor, and a base terminal coupled to receive the second sense current;
   a first means for biasing the base of said first transistor, said first means for biasing including a first diode element coupled to said first voltage supply means and further coupled at the base terminal of said first transistor to a first bias current source;
   a second means for biasing the base of said second transistor said second means for biasing, including a second diode element coupled to said first voltage supply means and further coupled at the base terminal of said second transistor to a second bias current source; and
   an AC-coupled positive feedback circuit which couples the collector terminal of said second transistor to the base terminal of said first transistor and which further couples the collector terminal of said first transistor to the base terminal of said second transistor to apply a portion of the respective voltage signals on said respective collector terminals.

2. The circuit of claim 1 further characterized by said AC-coupled positive feedback circuit means including:
   a first capacitor coupled between the base terminal of said first transistor and the collector terminal of said second transistor; and
   a second capacitor coupled between the base terminal of said second transistor and the collector terminal of said first transistor.

3. The circuit of claim 2 further including:
   a first sense current line capacitance coupled to the base terminal of said first transistor; and,
   a second sense current line capacitance coupled to the base terminal of said second transistor, the first capacitor and the first sense current line capacitance forming a voltage divider for providing a feedback signal from the collector terminal of said second transistor to the base terminal of said first transistor and the second capacitor and the second sense current line capacitor forming a voltage divider for providing a feedback signal from the collector terminal of said first transistor to the base terminal of said second transistor.

4. An improved sense amplifier circuit disposed for sensing information in the cells of a random access semiconductor memory comprising:
   a first transistor having a collector terminal coupled through a first resistance element to a first voltage supply means, an emitter terminal coupled to a first sense current source, and a base terminal coupled to a second voltage supply means;
   a second transistor having a collector terminal coupled through a second resistance element to said first voltage supply means, an emitter terminal coupled to a second current source, and a base terminal coupled to said second voltage supply means, and further coupled to the base terminal of said first transistor; and
   an AC coupled positive feedback circuit coupling the collector terminal of said first transistor to the emitter terminal of said first transistor, and further coupling the collector terminal of said second transistor to the emitter terminal of said second transistor, said collector terminal of said first transistor and said collector terminal of said second transistor comprising, respectively, first and second output terminals of said sense amplifier circuit.

5. The circuit of claim 4 further characterized by said AC-coupled positive feedback circuit means including:
   a first capacitor coupled between the collector terminal of said first transistor and the emitter terminal of said first transistor; and
   a second capacitor coupled between the collector terminal of said second transistor and the emitter terminal of said second transistor.

6. The circuit of claim 4, further including:
   a first bias current source coupled to the emitter terminal of said first transistor; and
   a second bias current source coupled to the emitter terminal of said second transistor.

* * * * *

UNITED STATES PATENT AND TRADEMARK OFFICE
CERTIFICATE OF CORRECTION

PATENT NO. : 4,547,685

DATED : October 15, 1985

INVENTOR(S) : Thomas S.W. Wong

It is certified that error appears in the above-identified patent and that said Letters Patent is hereby corrected as shown below:

The title page should be deleted to appear as per attached title page.

Signed and Sealed this

Tenth Day of June 1986

[SEAL]

Attest:

DONALD J. QUIGG

Attesting Officer

Commissioner of Patents and Trademarks

United States Patent [19]

Wong

[11] Patent Number: 4,547,685

[45] Date of Patent: Oct. 15, 1985

[54] SENSE AMPLIFIER CIRCUIT FOR SEMICONDUCTOR MEMORIES

[75] Inventor: Thomas S. W. Wong, San Jose, Calif.

[73] Assignee: Advanced Micro Devices, Inc., Sunnyvale, Calif.

[21] Appl. No.: 544,323

[22] Filed: Oct. 21, 1983

[51] Int. Cl.[4] .............. H03K 5/24; H03K 3/356; H03K 17/04

[52] U.S. Cl. .............. 307/530; 307/279; 307/578; 365/205; 365/208

[58] Field of Search .............. 307/530, 291, 578, 355, 307/362, 455; 365/189, 204, 205, 207, 208, 103, 104

[56] References Cited

U.S. PATENT DOCUMENTS

| | | | |
|---|---|---|---|
| 3,463,939 | 8/1969 | Sturman | 307/355 |
| 3,760,194 | 9/1973 | Lutz | 307/530 |
| 4,039,861 | 8/1977 | Heller et al. | 365/208 X |
| 4,162,539 | 7/1979 | Hebenstreit | 307/530 X |
| 4,264,832 | 4/1981 | Furman | 307/355 |
| 4,415,995 | 11/1983 | Glock | 307/530 X |

OTHER PUBLICATIONS

Ayling, "Differential Signal Phase Sensing and Latching Detector"; *IBM TDB;* vol. 14, No. 6, pp. 1674; 11/1971.

Schuster, "Sense Amplifier with Resistive Decoupling of Bit Lines"; *IBM TDB;* vol. 23, No. 7A, pp. 3037-3038, 12/1980.

Cordaro et al, "Amoeba Sense Amplifier and Regenerator"; *IBM TDB;* vol. 21, No. 4, pp. 1479-1482; 9/1978.

*Primary Examiner*—Larry N. Anagnos
*Attorney, Agent, or Firm*—J. Vincent Tortolano; Patrick T. King

[57] ABSTRACT

An improved sense amplifier circuit for sensing information in the cells of a semiconductor memory device is presented. The sense amplifier circuit as presented includes AC-coupled positive feedback means to provide a reduction in sensing delay time, and thus, faster memory access time.

6 Claims, 9 Drawing Figures